United States Patent
Brox et al.

Patent Number: 6,160,747
Date of Patent: Dec. 12, 2000

[54] CONFIGURATION FOR CROSSTALK ATTENUATION IN WORD LINES OF DRAM CIRCUITS

[75] Inventors: Martin Brox; Helmut Schneider, both of München, Germany; Thomas Vogelsang, Williston; Michael Killian, Ritchmont, both of Vt.

[73] Assignee: Siemens Aktiengesellschaft, Munich, Germany

[21] Appl. No.: 09/322,718

[22] Filed: May 28, 1999

[30] Foreign Application Priority Data

May 28, 1998 [DE] Germany ............... 198 23 956

[51] Int. Cl.$^7$ ........................................ G11C 7/00
[52] U.S. Cl. ............................. 365/204; 365/189.08
[58] Field of Search ............... 365/204, 189.08

[56] References Cited

U.S. PATENT DOCUMENTS

| | | | |
|---|---|---|---|
| 3,810,124 | 5/1974 | Hoffman et al. | 340/173 |
| 4,602,355 | 7/1986 | Watanabe | 365/206 |
| 4,764,903 | 8/1988 | Siebert | 367/29 |
| 5,161,121 | 11/1992 | Cho | 365/189.06 |
| 5,282,167 | 1/1994 | Tanaka et al. | 365/206 |

FOREIGN PATENT DOCUMENTS 0 415 408 A2   3/1991   European Pat. Off. .

*Primary Examiner*—David Nelms
*Assistant Examiner*—M. Tran
*Attorney, Agent, or Firm*—Herbert L. Lerner; Laurence A. Greenberg; Werner H. Stemer

[57] ABSTRACT

A configuration for crosstalk attenuation in substantially mutually parallel word lines of DRAM circuits, includes a decoder provided at a first end of a word line, and a holding transistor. A pull-down device is provided as a "noise killer" at a second end of the word line, which opposite the first end. The pull-down device pulls down the potential of the word line in a standby and hold mode in the event of an active adjacent word line.

5 Claims, 2 Drawing Sheets

CONFIGURATION FOR CROSSTALK ATTENUATION IN WORD LINES OF DRAM CIRCUITS

BACKGROUND OF THE INVENTION

Field of the Invention

The present invention relates to a configuration for crosstalk attenuation in substantially mutually parallel word lines of DRAM circuits, including a decoder provided at a first end of the word line, and a holding transistor.

In mutually parallel word lines of integrated DRAM circuits, crosstalk occurs between adjacent word lines. The crosstalk has an interfering effect which is all the more pronounced the closer the word lines are to one another and the longer the word lines are. The crosstalk is attributable to capacitive coupling between the word lines, which behave like long RC lines.

In order to prevent such crosstalk, a concept previously thought of entails restricting the length of the word lines being used in such a way that voltages generated by crosstalk do not exceed a critical value.

However, restricting the length of the word lines that are used is at odds which the aim of providing DRAM circuits with as many memory cells as possible.

SUMMARY OF THE INVENTION

It is accordingly an object of the invention to provide a configuration for crosstalk attenuation in word lines of DRAM circuits, which overcomes the hereinafore-mentioned disadvantages of the heretofore-known devices of this general type and in which the word lines run essentially parallel to one another, enabling crosstalk between adjacent word lines to be reliably avoided without restricting the length of word lines.

With the foregoing and other objects in view there is provided, in accordance with the invention, in a DRAM circuit having substantially mutually parallel word lines with first and second opposite ends, a configuration for crosstalk attenuation in the word lines, comprising a decoder at the first end of a word line; a holding transistor; and a pull-down device at the second end of the word line for pulling down a potential of the word line in a standby and hold mode in the event of an active adjacent word line.

In the configuration according to the invention, the pull-down device provided at one end of each word line behaves as a "noise killer" and ensures that the potential of a non-activated word line is pulled down whenever a potential increase can be observed due to crosstalk from an adjacent, activated word line.

The pull-down device can be configured in a variety of ways:

For example, the pull-down device may include an invertor, having an output which is connected to the gate of an N-channel MOS transistor connected to the word line.

However, it is also possible to use the holding transistor for the pull-down device, in other words to relocate the holding transistor from that end of the word line which is connected to the decoder to the opposite, second end of the word line.

Finally, it is alternatively possible to use an N-channel MOS transistor which can be driven by an array control signal for the pull-down device. In this case, the configuration has two N-channel MOS transistors, namely the N-channel MOS transistor for the holding transistor and the N-channel MOS transistor for the pull-down device.

The example that was mentioned last, in other words a configuration having two N-channel MOS transistors, is particularly advantageous since it enables the word line to be switched off rapidly from both ends by virtue of double-ended attenuation occurring in this case on the word lines adjacent an active word line. In addition, segment selection may be performed by the array control signal.

The example that was mentioned in the second instance is particularly advantageous, as far as the circuitry outlay is concerned, since the simple relocation of the holding transistor to that end of the word line which is opposite to the decoder means that no additional components are required.

On the other hand, in the example that was mentioned first, with the invertor and the N-channel MOS transistor, no additional signals are necessary for activating the pull-down device.

Other features which are considered as characteristic for the invention are set forth in the appended claims.

Although the invention is illustrated and described herein as embodied in a configuration for crosstalk attenuation in word lines of DRAM circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
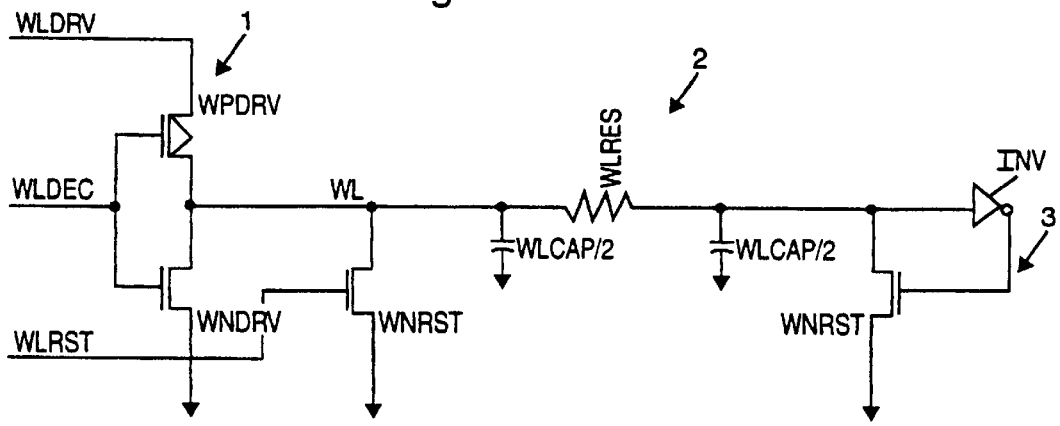
FIGS. 1, 2 and 3 are schematic circuit diagrams showing first, second and third exemplary embodiments of the configuration according to the invention.

Referring now to the figures of the drawings in detail and first, particularly, to FIG. 1 thereof, there is seen a first exemplary embodiment of a configuration according to the invention, with a decoder 1 including a P-channel MOS transistor WPDRV and an N-channel MOS transistor WNDRV, a holding transistor in the form of an N-channel MOS transistor WNRST, and a word line WL. The decoder 1 is driven by signals WLDEC and WLDRV, while a signal WLRST is applied to the holding transistor WNRSC.

A capacitive coupling of a configuration 2 including the word line WL to non-illustrated adjacent word lines is indicated by coupling capacitances WLCAP/2, while a resistive behavior of the word line WL is illustrated by a resistor WLRES.

In a standby mode, the signals WLRST and WLDEC are both at a high state ("H") while the signal WLDRV is at zero potential ("0"). The word line WL is at "0" in this case.

In a first hold mode (which is also called a "Mix1" mode), the signal WLRST is "0", while the signals WLDEC and WLDRV are both "H". The word line WL is "0" in this case. In a second hold mode (which is also called a "Mix2" mode), the signal WLRST is "H", while the signals WLDRV and WLDEC are both "0". The word line WL is at "0" in this case.

In an active mode of the configuration 2, the signals WLRST and WLDEC are both "0", while the signal WLDRV is at "H". The word line WL is at "H" in this case.

As has already been explained in the introduction, a long word line WL which is at "H" influences adjacent word lines due to capacitive coupling, so that "crosstalk" occurs. That crosstalk is intended to be avoided. For this purpose, the invention provides a pull-down device 3 which, in the exemplary embodiment of FIG. 1, includes an invertor INV at an end of the word line WL that is opposite to the decoder 1, and an N-channel MOS transistor WNRST. The transistor WNRST has a gate terminal which is connected to an output of the invertor. This pull-down device 3, which requires no additional signals, pulls the potential of the word line WL down if that potential is increased to a potential which differs from the state "0" as a result of crosstalk from an adjacent word line which is in the active state "H".

Figure 2:
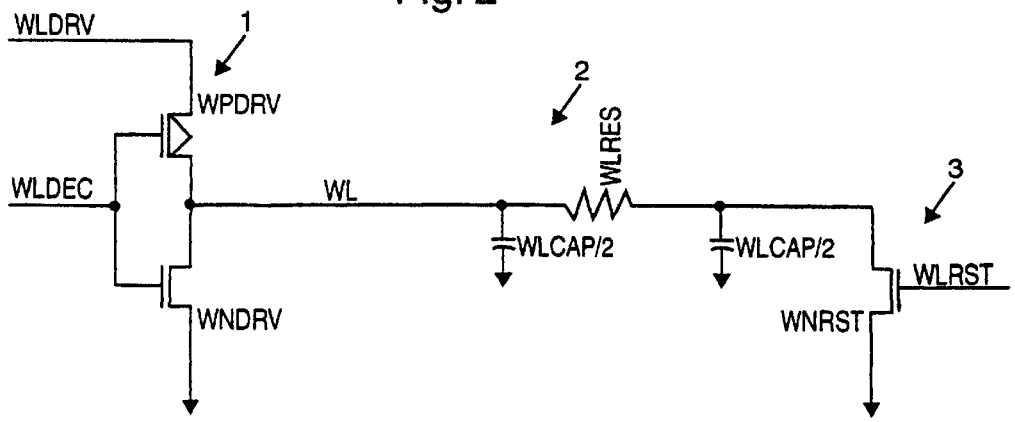

FIG. 2 shows a further exemplary embodiment of the invention, in which the holding transistor WNRST is relocated at the end of the word line WL which is remote from the decoder 1, and acts in this case as the pull-down device 3 that is driven by the signal WLRST. This exemplary embodiment has the particular advantage of requiring no additional transistors and/or components.

Figure 3:
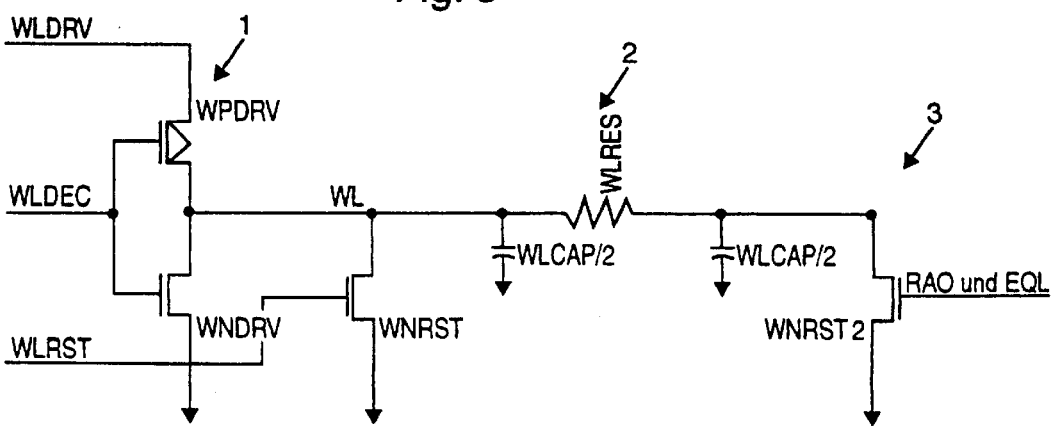

FIG. 3 shows a further exemplary embodiment of the invention in which, in addition to the first holding transistor WNRST constructed as an N-channel MOS transistor, a second N-channel MOS transistor WNRST2 is disposed as a pull-down device 3 at that end of the word line WL which is opposite to the decoder 1. This transistor WNRST2 ensures particularly good crosstalk attenuation in conjunction with a low degree of loading on the word line WL, since double-ended attenuation is present on the word lines adjacent an active word line WL. Moreover, there is no need for signals which are critical with respect to time and have to be applied to the word line externally.

Figure 4:
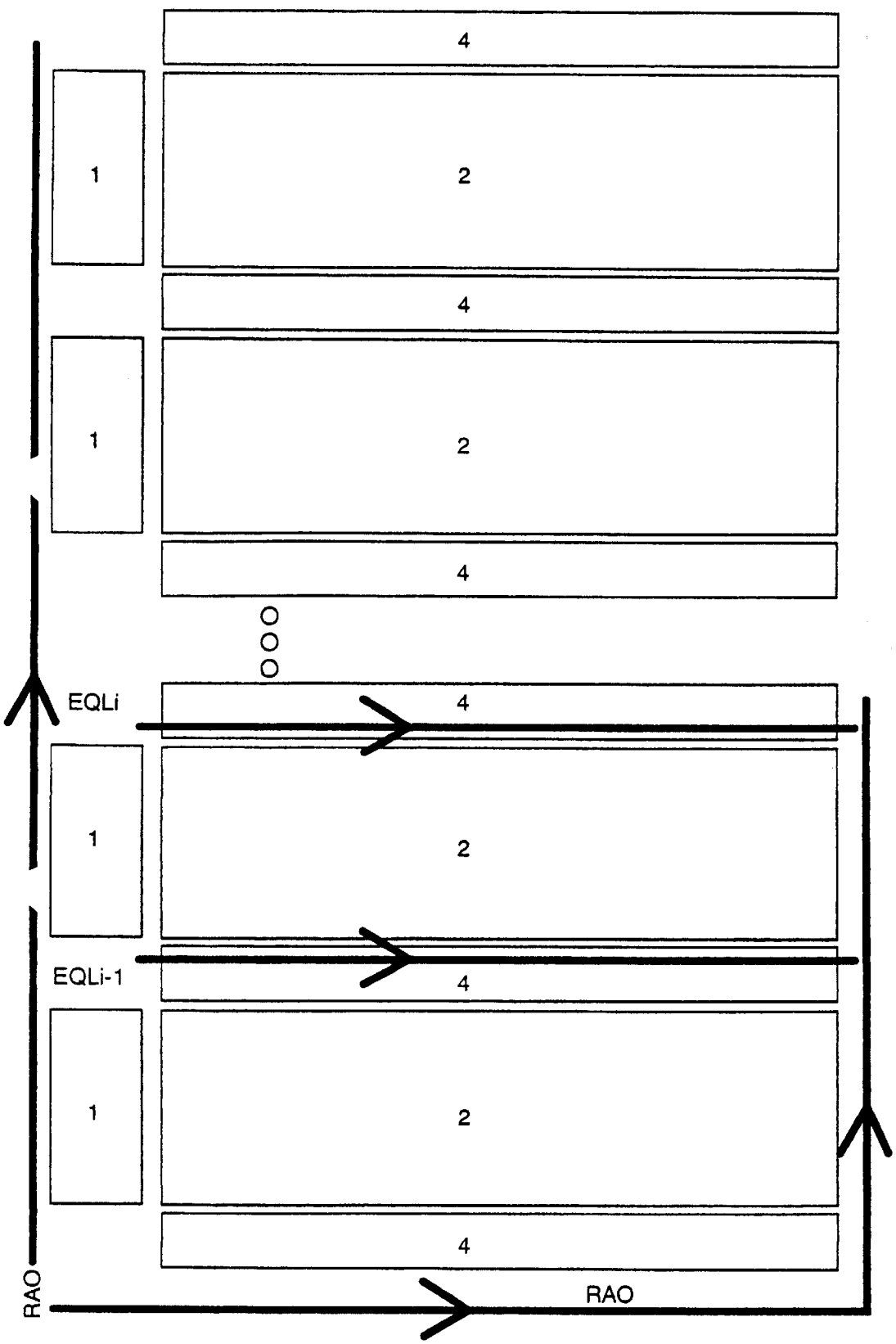
FIG. 4 is a diagrammatic view further elucidating the third exemplary embodiment of FIG. 3.

The exemplary embodiment of FIG. 3 allows segment selection using array control signals RAO and EQLi, EQLi-1 . . . , with the result that, as a function of the signal RAO, for example, every second word line is held at ground at its end opposite to the decoder 1. This is illustrated for a plurality of configurations 2, together with sense amplifiers 4 in FIG. 4.

We claim:

1. In a DRAM circuit having substantially mutually parallel word lines with first and second opposite ends, a configuration for crosstalk attenuation in the word lines, comprising:

a decoder at the first end of a word line;

an N-channel holding transistor connected to the word line and having a gate, said N-channel holding transistor forming a pull-down device at the second end of the word line, said pull-down device pulling down a potential of the word line in a standby and hold mode in the event of an active adjacent word line, and said pull-down device having an invertor with an output connected to the gate of said N-channel holding transistor.

2. In a DRAM circuit having substantially mutually parallel word lines with first and second opposite ends, a configuration for crosstalk attenuation in the word lines, comprising:

a decoder at the first end of a word line;

a holding transistor connected to the word line, said holding transistor formed of an N-channel MOS transistor driven by a signal for permitting double-ended attenuation on the word line adjacent an active word line; and a pull-down device at the second end of the word line, said pull-down device pulling down a potential of the word line in a standby and hold mode in the event of an active adjacent word line, said pull-down device formed of an N-channel MOS transistor having a gate to be driven by array control signals for permitting a segment selection of word lines.

3. In a DRAM circuit having substantially mutually parallel word lines with first and second opposite ends, a configuration for crosstalk attenuation in the word lines, comprising:

a decoder at the first end of a word line;

an N-channel holding transistor connected to the word line and having a gate; and an N-channel MOS transistor to be driven by an array control signal, said N-channel MOS transistor forming a pull-down device, said pull-down device at the second end of the word line, said pull-down device pulling down a potential of the word line in a standby and hold mode in the event of an active adjacent word line, and said pull-down device having an invertor with an output connected to the gate of said N-channel holding transistor.

4. The configuration according to claim 3, wherein a segment selection of word lines is possible by using array control signals.

5. In a DRAM circuit having substantially mutually parallel word lines with first and second opposite ends, a configuration for crosstalk attenuation in the word lines, comprising:

a decoder at the first end of a word line;

a holding transistor connected to the word line, said holding transistor formed of an N-channel MOS transistor driven by a signal for permitting double-ended attenuation on the word line adjacent an active word line, said holding transistor forming a pull-down device at the second end of the word line, said pull-down device pulling down a potential of the word line in a standby and hold mode in the event of an active adjacent word line, said pull-down device formed of an N-channel MOS transistor having a gate for permitting a segment selection of word lines.

* * * * *